United States Patent
Chen et al.

(10) Patent No.: US 9,543,159 B2
(45) Date of Patent: Jan. 10, 2017

(54) PATTERNING PROCESS OF A SEMICONDUCTOR STRUCTURE WITH A WET STRIPPABLE MIDDLE LAYER

(71) Applicant: Taiwan Semiconductor Manufacturing Company, Ltd., Hsin-Chu (TW)

(72) Inventors: Chien-Chih Chen, Taipei (TW); Chia-Wei Chen, Hsinchu (TW); Ching-Yu Chang, Yilang County (TW); Shao-Jyun Wu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/671,552

(22) Filed: Mar. 27, 2015

(65) Prior Publication Data

US 2016/0284557 A1    Sep. 29, 2016

(51) Int. Cl.
*H01L 21/30* (2006.01)
*H01L 21/02* (2006.01)
(Continued)

(52) U.S. Cl.
CPC ....... *H01L 21/3081* (2013.01); *H01L 21/0271* (2013.01); *H01L 21/0274* (2013.01);
(Continued)

(58) Field of Classification Search
CPC ............... H01L 21/3081; H01L 21/266; H01L 21/3086; H01L 21/02126; H01L 21/02216; H01L 21/3122; H01L 21/0274; H01L 21/0276; H01L 21/31111; H01L 21/31138; H01L 21/67075; G03F 7/094; G03F 7/095; G03F 7/11; G03F 7/168; G03F 7/0045; G03F 7/0752; G03F 7/0757; G03F 7/091; G03F 7/004; G03F 7/0758; C08L 83/04; C08L 83/00
(Continued)

(56) References Cited

U.S. PATENT DOCUMENTS 8,216,767 B2    7/2012  Wang et al.
8,323,870 B2    12/2012  Lee et al.
(Continued)

FOREIGN PATENT DOCUMENTS

JP    2007-047580    *  2/2007
TW    200809921 A    2/2008
TW    201402800 A    1/2014

*Primary Examiner* — Caleen Sullivan
(74) *Attorney, Agent, or Firm* — Haynes and Boone, LLP

(57) ABSTRACT

A lithography method is provided in accordance with some embodiments. The lithography method includes forming an under layer of a polymeric material on a substrate; forming a silicon-containing middle layer on the under layer, wherein the silicon-containing middle layer has a silicon concentration in weight percentage less than 20% and is wet strippable; forming a patterned photosensitive layer on the silicon-containing middle layer; performing a first etching process to transfer a pattern of the patterned photosensitive layer to the silicon-containing middle layer; performing a second etching process to transfer the pattern to the under layer; and performing a wet stripping process to the silicon-containing middle layer and the under layer.

20 Claims, 14 Drawing Sheets

(51) Int. Cl.
*H01L 21/308* (2006.01)
*H01L 21/266* (2006.01)
*H01L 21/027* (2006.01)
*H01L 21/32* (2006.01)
*H01L 21/67* (2006.01)

(52) U.S. Cl.
CPC ........ *H01L 21/0276* (2013.01); *H01L 21/266* (2013.01); *H01L 21/3086* (2013.01); *H01L 21/02126* (2013.01); *H01L 21/32* (2013.01); *H01L 21/67075* (2013.01)

(58) Field of Classification Search
USPC .................................................... 438/514
See application file for complete search history.

(56) References Cited

U.S. PATENT DOCUMENTS

| | | | |
|---|---|---|---|
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2003/0032300 A1* | 2/2003 | Waldfried | H01L 21/31138 438/725 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |

* cited by examiner

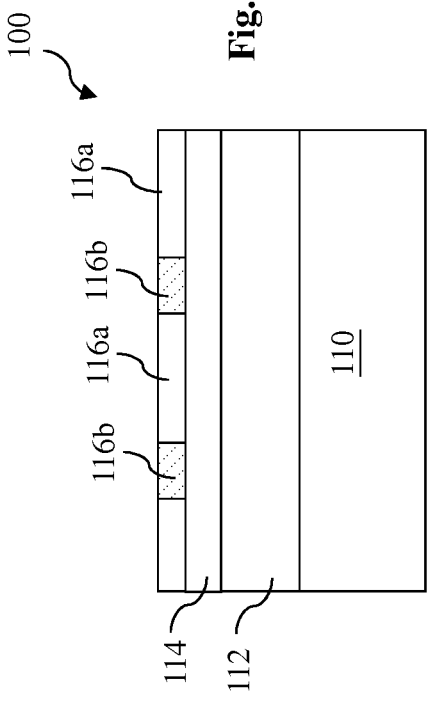
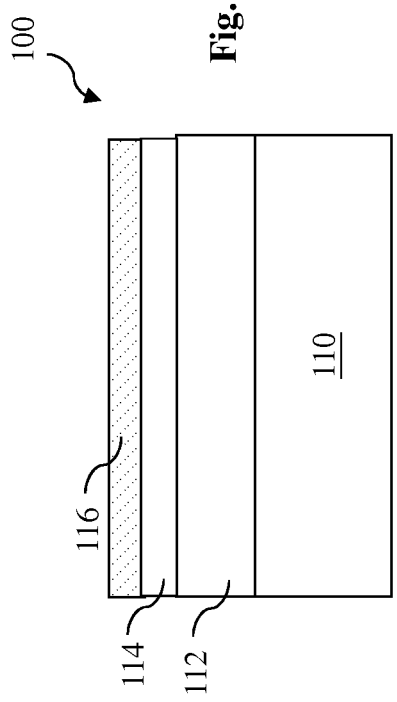
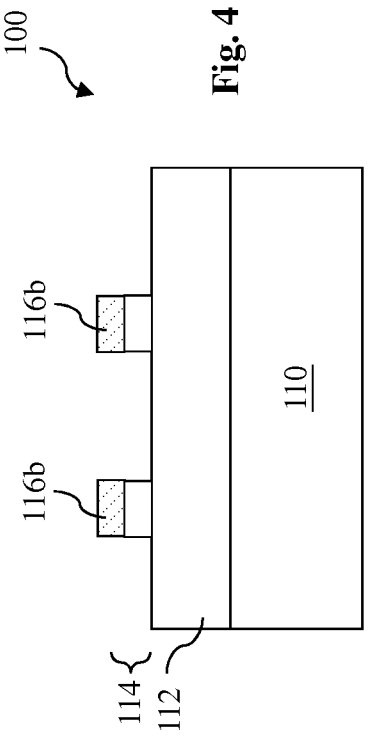
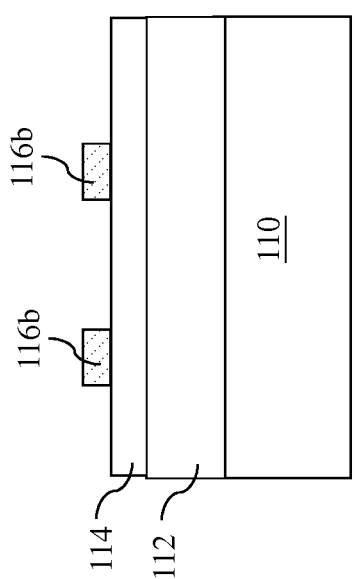

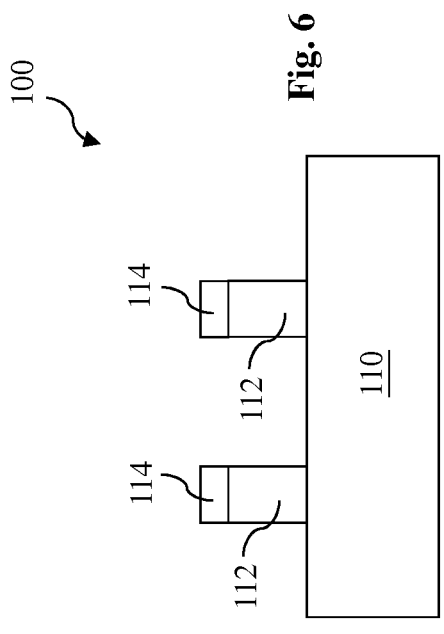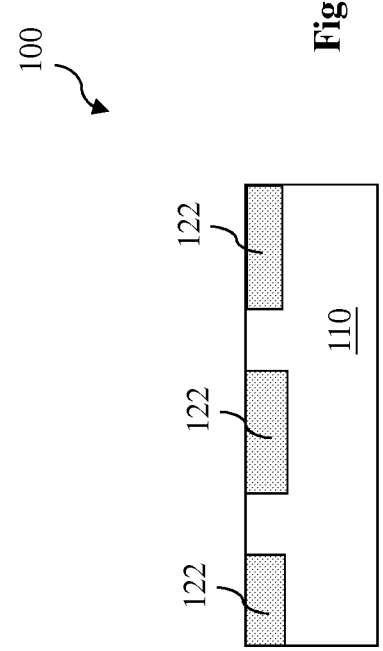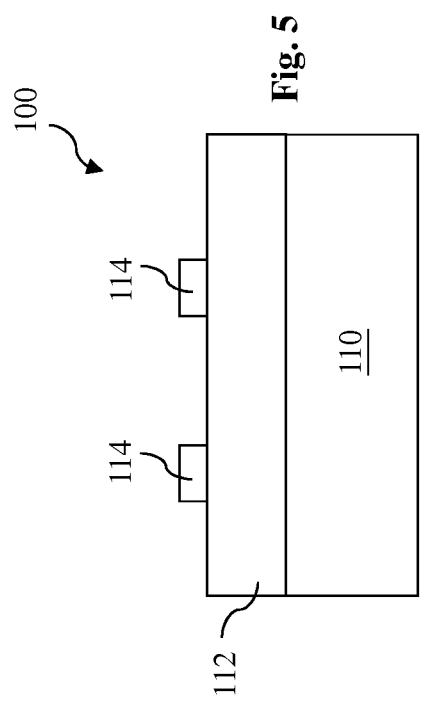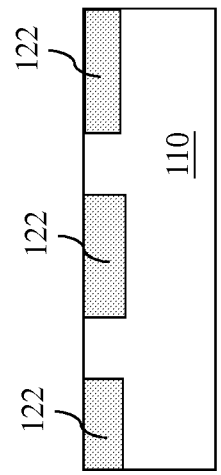

US 9,543,159 B2

PATTERNING PROCESS OF A SEMICONDUCTOR STRUCTURE WITH A WET STRIPPABLE MIDDLE LAYER

BACKGROUND

In integrated circuit (IC) fabrications, a patterned photoresist layer is used to transfer a designed pattern having small feature sizes from a photomask to a wafer. The photoresist is light-sensitive and can be patterned by a photolithography process. Furthermore, the photoresist layer provides resistance to etch or ion implantation, which further requires a sufficient thickness. When IC technologies are continually progressing to smaller feature sizes, for example, down to 32 nanometers, 28 nanometers, 20 nanometer and below, the thickness is not scaled down accordingly since the resistance requirement. Depth of focus sufficient enough to cover the thicker photoresist will degrade the imaging resolution. Multiple-film photoresist is introduced to overcome the above challenge. However, the additional material(s) in the multiple-film photoresist is difficult to be removed, either damaging the substrate or left residues.

Therefore, there is need for a photoresist material and a lithography method to address the above issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 8 illustrate sectional views of one exemplary semiconductor structure at various fabrication stages, constructed in accordance with some embodiments.

DETAILED DESCRIPTION

Figure 9:
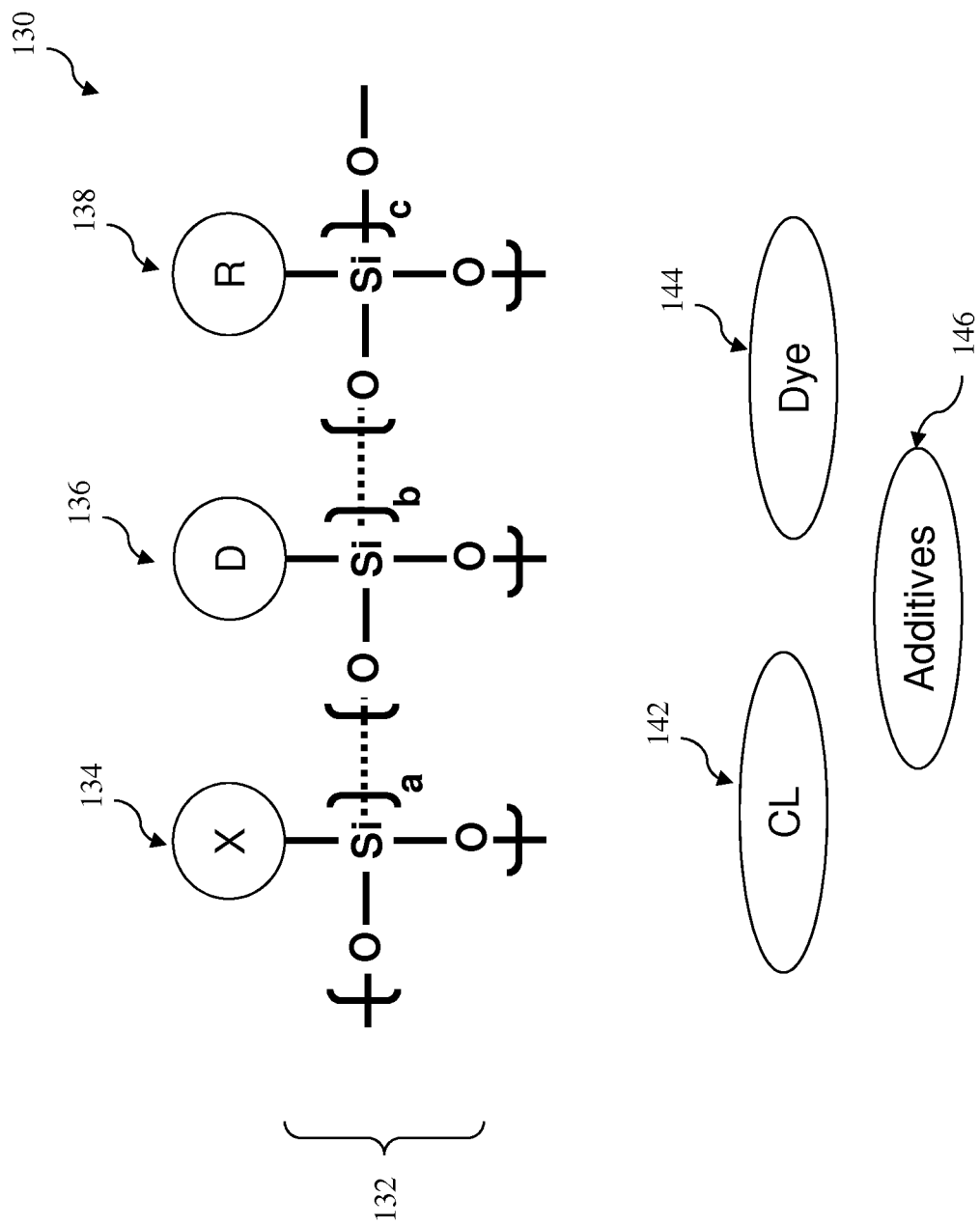
FIG. 9 is a diagrammatical view of a chemical structure in a middle layer used in a photolithography process, constructed according to aspects of the present disclosure in some embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1 through 8 provide sectional views of a semiconductor structure 100 at various fabrication stages in accordance with some embodiments. The semiconductor structure 100 and the method making the same are collectively described with reference to FIGS. 1-18.

Referring to FIG. 1, the semiconductor structure is a semiconductor wafer in the present embodiment. The semiconductor structure 100 includes a semiconductor substrate 110, such as a silicon substrate in some embodiments. The substrate 110 may include another elementary semiconductor, such as germanium, or diamond in some embodiments. The substrate 110 may include a compound semiconductor, such as silicon carbide, gallium arsenic, indium arsenide, and indium phosphide. The substrate 110 may include an alloy semiconductor, such as silicon germanium, silicon germanium carbide, gallium arsenic phosphide, and gallium indium phosphide. The substrate 110 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 110 may include a semiconductor-on-insulator (SOI) structure. For examples, the substrate may include a buried oxide (BOX) layer formed by a process such as separation by implanted oxygen (SIMOX). In other embodiments, the substrate 110 may include a glass such as in thin film transistor (TFT) technologies.

The semiconductor structure 100 may also include other material layers and other circuit patterns. For examples. The semiconductor structure 100 includes various doped features, such as doped well structure (e.g., a P-typed doped well and an N-type doped well) formed in the semiconductor substrate 110. In other embodiments, the semiconductor structure 100 may further include one or more material layers to be patterned (by etching to remove or ion implantation to introduce dopants), such as a dielectric layer to be patterned to form trenches for conductive lines or holes for contacts or vias; a gate material stack to be patterned to form gates; or a semiconductor material to be patterned to form isolation trenches. For example, a material layer to be patterned is a semiconductor layer as a part of the semiconductor substrate 110. In other embodiments, multiple semiconductor material layers, such as gallium arsenic (GaAs) and aluminum gallium arsenic (AlGaAs), are epitaxially grown on the semiconductor substrate and are patterned to form various devices, such as light-emitting diodes (LEDs). In some other embodiments, the semiconductor structure 100 includes fin active regions and three dimensional fin field-effect transistors (FinFETs) formed or to be formed thereon.

Still referring to FIG. 1, a tri-layer photoresist is formed on the semiconductor substrate 110. An under layer 112 is formed on the semiconductor substrate 110. The under layer 112 is designed to provide resistance to etching or ion implantation. The under layer 112 functions as a mask to protects the substrate 110 from etching or ion implantation. Accordingly, the under layer 112 has a sufficient thickness to achieve this. In some embodiments, the under layer 112 includes an organic polymer free of silicon. In some embodiments, the formation of the under layer 112 includes spin-on coating and curing (such as a thermal baking process with a proper baking temperature).

Still referring to FIG. 1, a middle layer 114 is formed on the under layer 112. The middle layer 114 is a silicon-containing layer designed to provide etch selectivity from the under layer 112. In the present embodiment, the middle layer 114 functions an etch mask to transfer a pattern to the under layer 112. In some embodiments, the middle layer 114 is also designed to function as a bottom anti-reflective coating that reduces reflection during a lithography exposure process, thereby increasing the imaging contrast and enhancing the imaging resolution. The silicon-containing middle layer 114 and the silicon-free under layer 112 are designed to have etching selectivity. In some embodiments, the formation of the middle layer 114 includes spin-on coating and curing (such as a thermal baking process with a suitable baking temperature).

Existing middle layer is hard to remove. When a plasma etching process is applied to remove the middle layer, the plasma etching process likely damages the semiconductor substrate 110. The existing wet etching process is not effective to remove the middle layer. The disclosed method and the middle layer 114 are designed such that the middle layer 114 is able to be effectively removed by wet stripping without damaging the semiconductor structure 100. Accordingly, the middle layer 114 is referred to as wet strippable middle layer.

The wet strippable middle layer 114 includes a silicon-containing polymer (or simply silicon polymer) 130 with its chemical structure schematically illustrated in FIG. 9 in accordance with some embodiments. Particularly, the wet strippable middle layer 114 is designed to have long side chain and have silicon content less than 20% in weight percentage. By having long side chains, the weight percentage of silicon in the middle layer 114 is reduced. Accordingly, the long side chains are easy to be removed relative to the silicon-containing groups. Furthermore, the long side chains reduce the formation of O—Si—O during the dry etching process to pattern the under layer 112. The dry etching process applied to the under layer 112 forms a crust on the patterned middle layer and the crust is hard to be removed due to high silicon content. Therefore, the reduction of the O—Si—O formation during the dry etching process reduces the silicon content of the crust and makes the crust to be removed easily. Alternatively, the silicon-containing polymer 130 in the middle layer 114 is designed to have more, and/or longer organic chains. For the similar reasons, the more and/or longer organic chains will reduces the silicon content of the middle layer 114, which makes the removal of the middle layer and the crust easier without damaging the semiconductor structure 100.

The composition of the wet strippable middle layer 114 is further described according to various embodiments. The chemical structure of the silicon polymer 130 includes a backbone 132 having a plurality of O—Si—O groups chemically bonded together. In some embodiments, the O—Si—O groups may not be directly bonded together. For example, some other chemical groups may bridge two adjacent O—Si—O groups and bond the two adjacent O—Si—O groups together. The silicon polymer 130 further includes first organic groups 134 (labeled as "X") that provide crosslinking sites; aromatic groups 136 (labeled as "D") that modify the characteristics (such as refractive index n, extinction coefficient κ and/or etch resistance) of the middle layer 114; and second organic groups 138 (labeled as "R") that enhance the adhesion of the photoresist layer and tune other effects, such as etching performance and wet strippability.

The backbone 132 of the silicon polymer 130 includes a first subset bonded to the first organic groups 134, a second subset bonded to the aromatic groups 136, and a third subset bonded to the second organic groups 138, as illustrated in FIG. 9. Relative weight percentages of the first, second and third subsets of the O—Si—O groups are "a", "b", and "c", respectively (as labeled in FIG. 9). The sum a, b and c is 1 or 100%. The relative weight percentages a, b and c are adjusted such that various parameters are properly tuned. For example, when the less crosslinking sites are expected, the weight percentage "a" of the first subset of the O—Si—O groups is reduced. As noted above, in addition to respective functions, the chemical groups "X", "D", and "R" are designed to have long chains to further reduce the silicon content of the middle layer 114 and the silicon content of the crust as well, thereby making the removal of the both easier. In some embodiments, the middle layer 114 includes 1-4 alkyl groups bonded to silicon atoms in the backbone 132 by aliphatic or aromatic groups.

Figure 12:
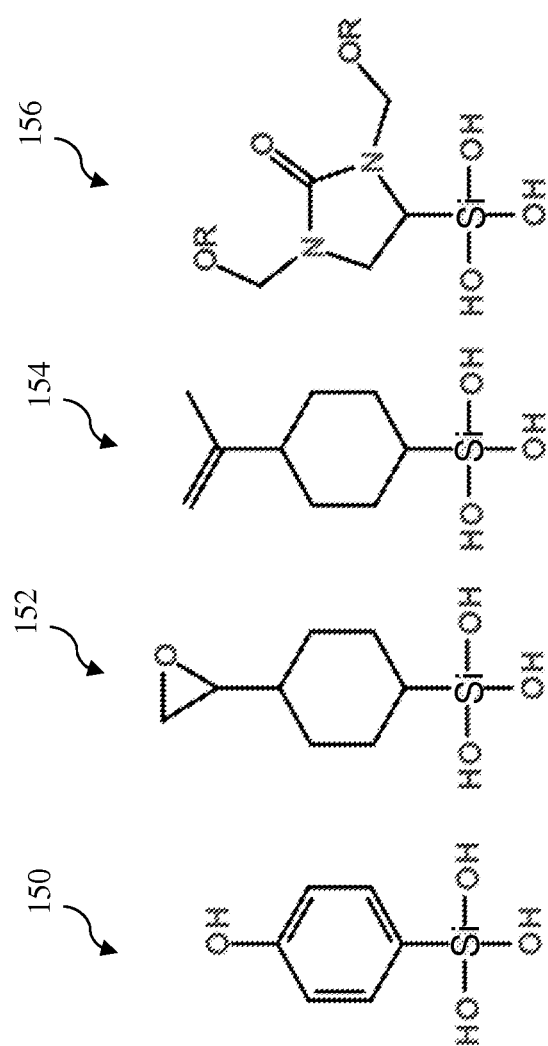
FIG. 12 is a diagrammatical view of the chemical structure of a first organic group in the middle layer, constructed according to aspects of the present disclosure in some embodiments.

In some embodiments, the first organic group (X) 134 is a cross-linker, which is an alkyl group having 2-20 carbons (C2-C20) with at least one crosslinkable functional group, such as —I, —Br, —Cl, —NH2, —COOH, —OH, —SH, —N3, epoxy, alkyne, alkene, ketone, aldehyde, ester, acyl halide, NHS ester, Imidoester, pentafluorophenyl ester, Hydroxymethyl phosphine, Carbodiimide, Maleimide, Haloacetyl, Pyridyldisulfide, Thiosulfonate, Vinylsulfone, Hydrazide, Alkoxyamine, Diazirine, Aryl azide, Isocyanate, Phosphine, Amide, ether, or a combination thereof. In some examples, the first organic group (X) 134 includes a chemical structure, such as 150, 152, 154 or 156, as illustrated in FIG. 12. The weight percentage "a" of the first organic group (X) 134 ranges from 0 to 1 in accordance with some embodiments.

Figure 13:
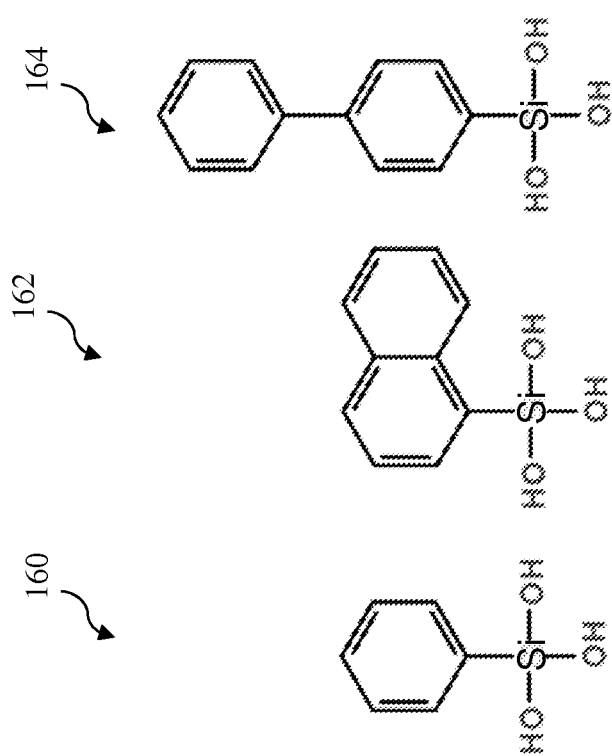
FIG. 13 is a diagrammatical view of the chemical structure of an aromatic organic group in the middle layer, constructed according to aspects of the present disclosure in some embodiments.

In some embodiments, the aromatic group (D) 136 includes a chromophore and includes an alkyl group having 3-20 carbons (C3-C20) with at least one light-sensitive functional group, such as aromatic groups or heterocyclic groups. The aromatic structures can be phenyl, napthlenyl, phenanthrenyl, anthracenyl, phenalenyl, or other aromatic derivatives containing one to five-membered rings. In some examples, the aromatic group (D) 136 includes a chemical structure, such as 160, 162 or 164, as illustrated in FIG. 13. The weight percentage "b" of the aromatic group (D) 136 ranges from 0 to 0.5 in accordance with some embodiments.

Figure 14:
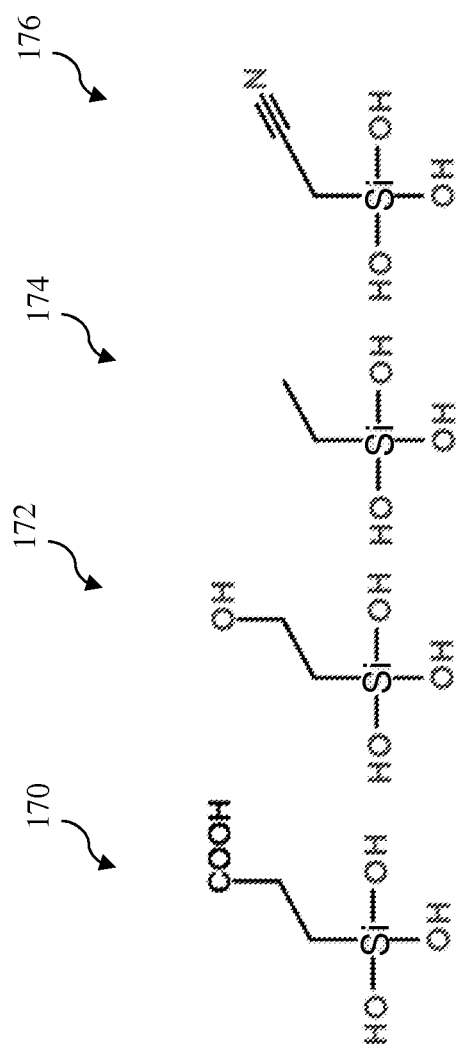
FIG. 14 is a diagrammatical view of the chemical structure of a second organic group in the middle layer, constructed according to aspects of the present disclosure in some embodiments.

In some embodiments, the second organic group (R) 138 includes an alkyl group having 1-20 carbons (C1-C20) with a non-cyclic structure or a cyclic structure. For example, the cyclic structure is an aromatic ring. The second organic group 138 is designed to enhance photoresist adhesion, etching resistance, and wet strippability. In other examples, the alkyl group further includes a functionalized group, such as —I, —Br, —Cl, —NH2, —COOH, —OH, —SH, —N3, —S(═O)—, alkene, alkyne, imine, ether, ester, aldehyde, ketone, amide, sulfone, acetic acid, cyanide, or a combination thereof. In some examples, the second organic group (R) 138 includes a chemical structure, such as 170, 172, 174 or 176, as illustrated in FIG. 14. The weight percentage "c" of the second organic group (R) 138 ranges from 0 to 0.5 in accordance with some embodiments.

Figure 15:
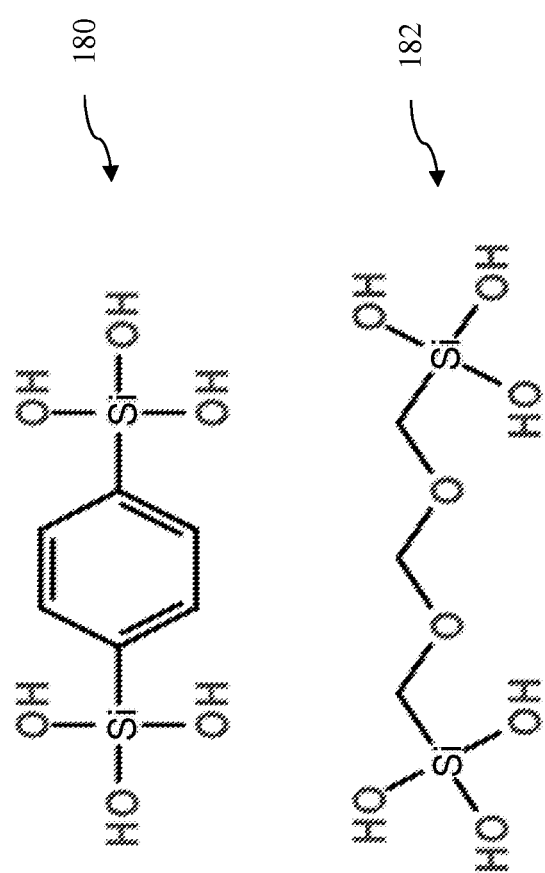
FIG. 15 is a diagrammatical view of a long chain chemical structure in the middle layer, constructed according to aspects of the present disclosure in some embodiments.

As noted above, the wet strippable middle layer 114 is designed to have long side chain in accordance with some embodiments. For examples, the first organic group 134, the aromatic group 136 and the second organic group 138 in the middle layer 114 all or at least one of three kinds have a long chain containing 5 to 20 carbons. Alternatively, the silicon-containing polymer 130 in the middle layer 114 is designed to have more, and/or longer carbon chains, thereby forming more polymers with low molecular weight during the cleaning process. For example, the backbone 132 of the silicon polymer 130 includes a chemical structure, such as 180, 182 or a combination thereof, as illustrated in FIG. 15, in accordance with some embodiments.

The strippable middle layer 114 further includes cross-linkers ("CL") 142, dye 144 and other additives 146, as illustrated in FIG. 9. The cross-linkers 142 functions to cross-link various chemicals in the middle layer into a polymeric network. Since the silicon-containing polymer 130 has less silicon content, the existing cross-linkers are not effective. The cross-linkers 142 are designed differently such that to be able to be chemically bonded to the crosslinking sites of the first organic group 134. In the present embodiment, the cross-linkers 142 are organic cross-linkers. In various embodiments, the cross-linkers 142 include an aromatic structure, an aliphatic structure, or a combination thereof. In some embodiments, the cross-linkers 142 are chemically bonded to the silicon-containing polymer 130 before crosslinking reaction. For example, each of the cross-linkers 142 is initially boned to the first organic group 134 prior to crosslinking reaction or is the first organic group 134.

The dye 144 is sensitive to light and is able to modify the characteristics (such as refractive index n and extinction coefficient κ) of the middle layer 114. In various embodiments, the dye 144 is portion of the aromatic group 136, or is chemically bonded thereto, or is chemically bonded to the second organic group 138.

The additive 146 may include various chemicals designed to modify the characteristics and enhance of the performance (such as wettability and accordingly enhancement of the cleaning mechanism during the cleaning process) of the middle layer 114. In some embodiments, the additives 146 include surfactant, fluoro-containing groups, or both.

In the present embodiment, the middle layer 114 also includes solvent when it is disposed on the under layer 112. In various example, the solvents includes isopropyl alcohol (IPA), propylene glycol methyl ether (PGEE), propylene glycol monomethyl ether acetate (PGMEA), H2O, ether, alcohol, ketone, or ester.

Figure 10:
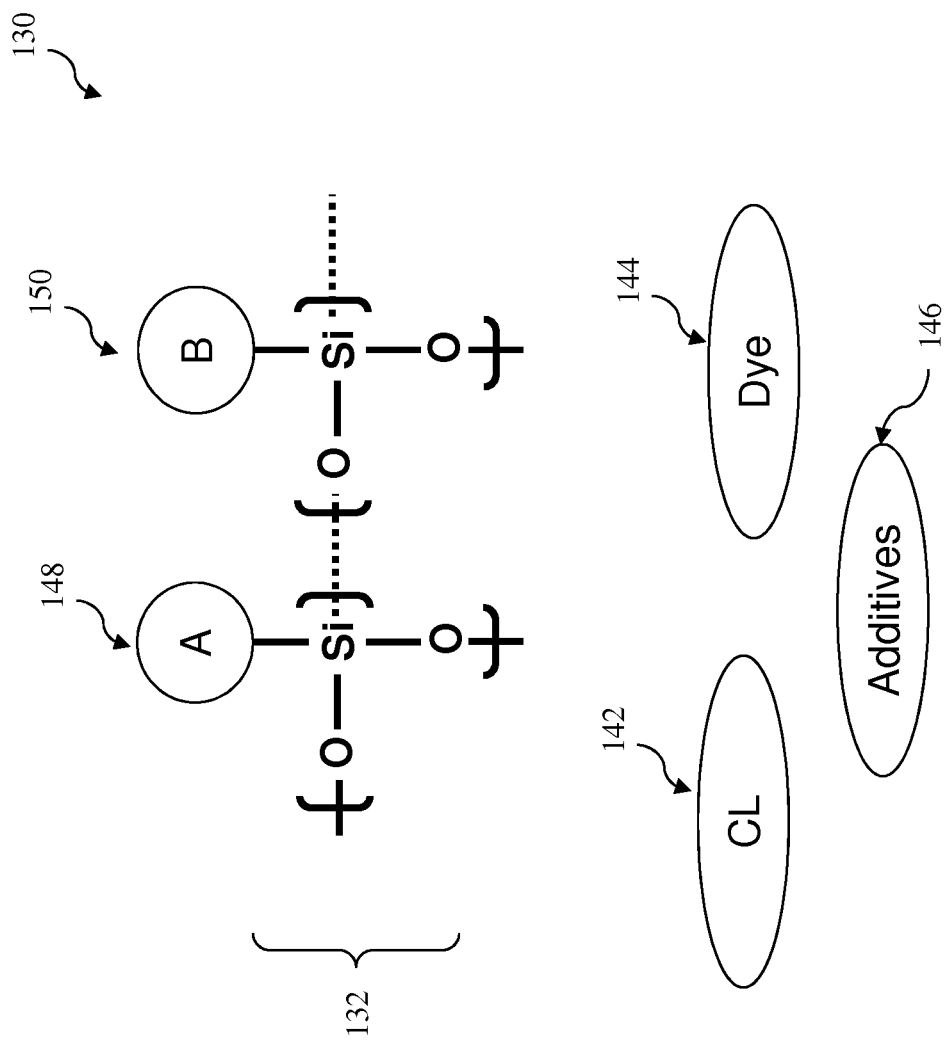
FIG. 10 is a diagrammatical view of a chemical structure in a middle layer used in a photolithography process, constructed according to aspects of the present disclosure in some embodiments.

In some embodiments, the silicon polymer 130 uses silicon-containing monomers having an electron donating group (EDG, labeled as "A") 148, an electron withdrawing group (EWG, labeled as "B") 150, or both, as illustrated in FIG. 10. EDG 148 stabilizes the silicon cation and weakens the Si—O bonds. EWG 150 is able to reduce the nucleophilicity of the oxygen and also weakens the Si—O bonds in the silicon-containing monomers with the EDG 148. Thereby, some Si—O bonds in the silicon polymer are easily cleaved. In some embodiments, EDG, EWG or both are incorporated into at least some of the first organic group (X) 134, the aromatic group (D) 136 and the second organic group (R) 138. In furtherance of the embodiments, at least a subset of the chemical groups X, D and R are designed to include EDG, EWG or both.

Figures 16, 17:
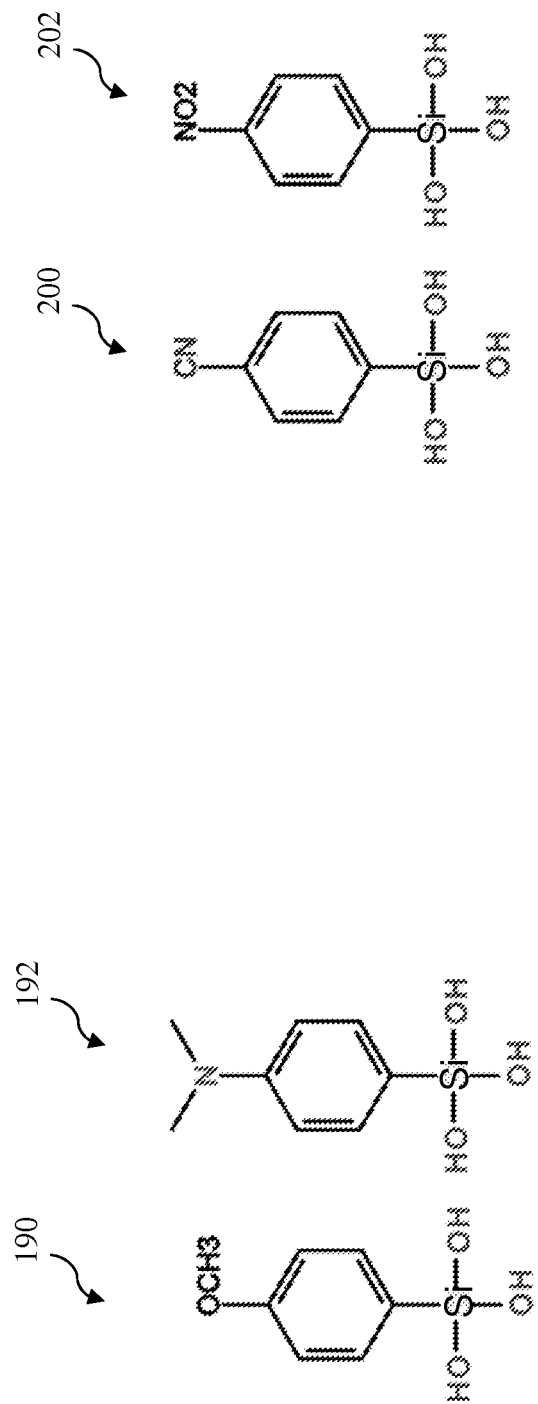
FIG. 16 is a diagrammatical view of the chemical structure of an electron donating group in the middle layer, constructed according to aspects of the present disclosure in some embodiments.
FIG. 17 is a diagrammatical view of the chemical structure of an electron withdrawing group in the middle layer, constructed according to aspects of the present disclosure in some embodiments.

In some embodiments, EDG 148 includes one of primary, secondary, tertiary carbon groups, aromatic rings, aliphatic groups, heterocyclic rings, —OR, —OH, NR2, —NHR, —NH2, —SR, —SH, —PR3, —PHR2, —PH2R, —PH3, alkenes, alkynes, and a combination thereof. In some embodiments, the EDG 148 includes a chemical group, such as 190 or 192, as illustrated in FIG. 16, in accordance with some embodiments.

In some embodiments, EWG 150 includes one of aromatic rings, aliphatic groups, heterocyclic rings, —CN, —NO2, —C(═O)—, —COOH, —OR, —C(═NR)—, —SO2, —S(═O)—, —COOR, —OH, —CONHR, —CONR2, alkenes, alkynes, halides, and a combination thereof. In some embodiments, the EWG 150 includes a chemical group, such as 200 or 202, as illustrated in FIG. 17, in accordance with some embodiments.

Figure 11:
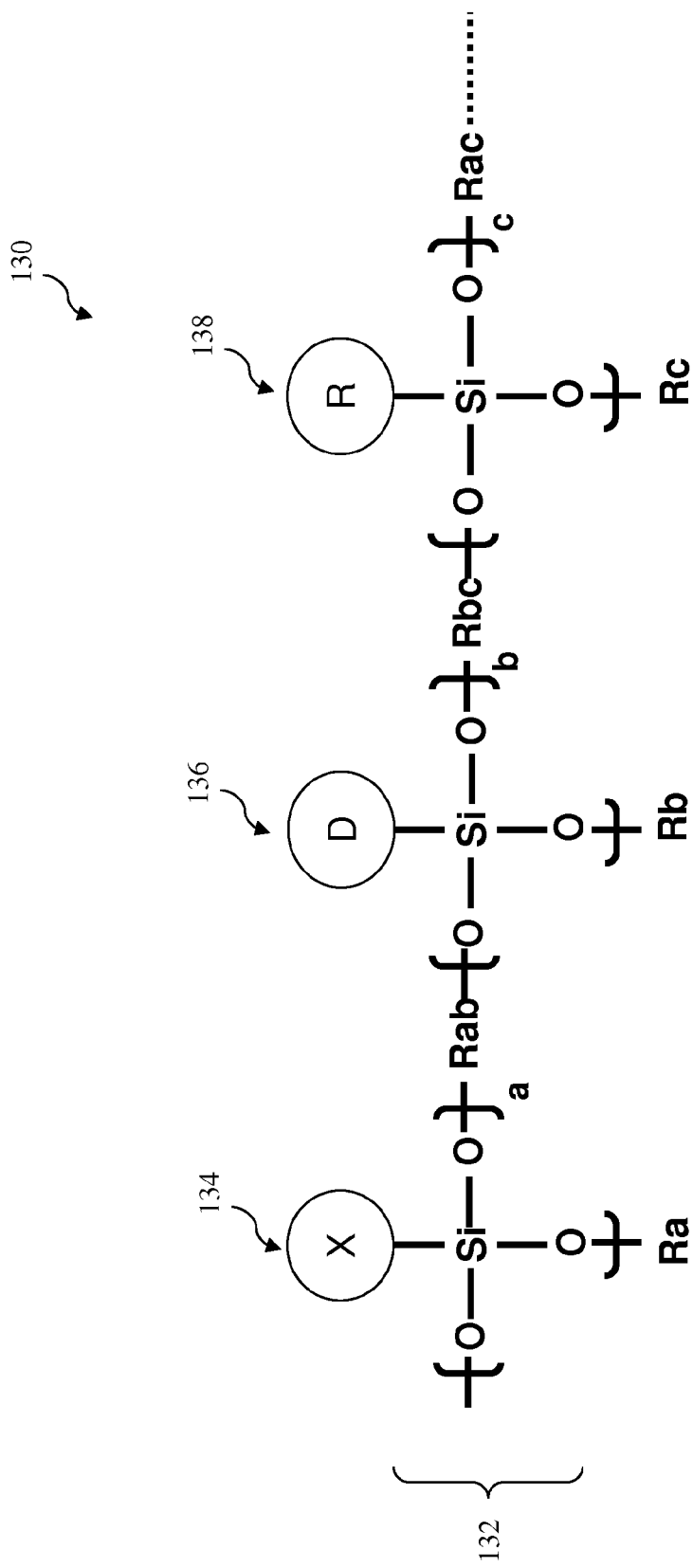
FIG. 11 is a diagrammatical view of a chemical structure in a middle layer used in a photolithography process, constructed according to aspects of the present disclosure in some embodiments.

In some embodiments, the chemical structure of the silicon polymer 130 includes a backbone 132 having a plurality of O—Si—O groups and chemical spacers bonding the adjacent O—Si—O groups together, as illustrated in FIG. 11. In the present embodiments, the chemical spacers include carbon but are free of silicon, therefore also referred to as carbon spacers. A carbon spacer bonds two adjacent the O—Si—O group together, forming a Si—O—R—O—Si, where R is a carbon spacer. Such a structure is easily cleaved by an acid treatment. In other words, the chemical spacers are acid-cleavable. In FIG. 11, various carbon spacers, such as Ra, Rb, Rc, Rab, Rbc and Rac, are incorporated into the backbone 132 of the silicon polymer 130. Particularly, carbon spacer Rab is interposed and bonded between the first organic group X and the aromatic group D; carbon spacer Rbc is interposed and bonded between the aromatic group D and the second organic group R; carbon spacer Rac is interposed and bonded between the first organic group X and the second organic group R; carbon spacer Ra is interposed and bonded between two first organic groups X; carbon spacer Rb is interposed and bonded between two aromatic groups D; and carbon spacer Rc is interposed and bonded between two second organic group R. In furtherance of the embodiments, the silicon polymer 130 is free of the Si—O—Si bonds due to the incorporation of the spacers in the backbone 132. Finally, the middle layer 114 is easily stripped. Furthermore, it reduces the formation of Si—O—Si during the dry etching process to pattern the under layer 112. Therefore, the corresponding crust generated by the dry etching process has less Si—O—Si group, thus improving the solubility of the crust in wet chemical cleaning, such as by sulfuric peroxide mixture (SPM) and ammonia peroxide mixture (SC-1 or APM).

Figure 18:
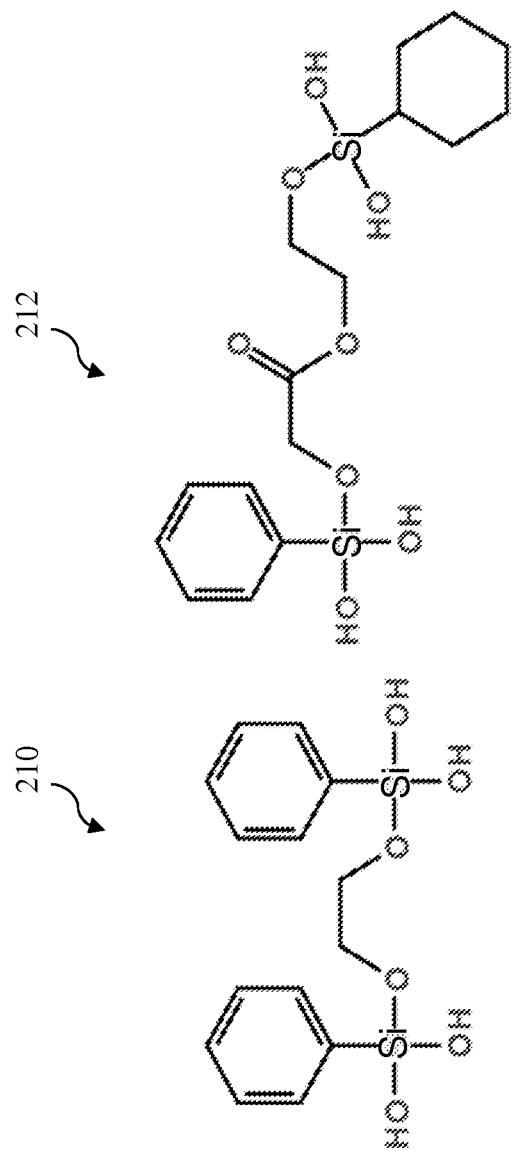
FIG. 18 is a diagrammatical view of the chemical structure of an acid-cleavable group in the middle layer, constructed according to aspects of the present disclosure in some embodiments.

In some embodiments, at least one or all of the acid-cleavable groups Rab, Rbc and Rac includes a simple alkyl group or an acid-cleavable group, such as aromatic rings, aliphatic groups, heterocyclic rings, —C(=O)—, —C(=NR)—, —SO2, —S(=O)—, —COOR, —CONHR, —CONR2, ethers, alkenes, or alkynes. In some examples, the acid-cleavable group (Rab, Rbc, Rac or all) includes a chemical group, such as 210 or 212, as illustrated in FIG. 18.

Referring back to FIG. 1, a photoresist layer (photosensitive layer or resist layer) 116 is formed on the middle layer 114. The formation of the photoresist layer 116 may include spin-on coating and baking process. The photoresist layer 116 may include a photosensitive chemical, a polymeric material and a solvent. In some embodiments, the photosensitive layer 116 utilizes a chemical amplification (CA) resist material. For example, a positive CA resist material includes a polymer material that turns soluble to a developer such as a base solution after the polymeric material is reacted with acid. Alternatively, the CA resist material can be negative and include a polymer material that turns insoluble to a developer such as a base solution after the polymer is reacted with acid. The photoresist layer 116 further includes a solvent. The solvent may be partially evaporated by a soft baking process. In furtherance of the embodiments when the CA resist material is used, the photosensitive chemical includes photo-acid generator (PAG) distributed in the photoresist layer. When absorbing photo energy, the PAG decomposes and forms a small amount of acid. The PAG may have a concentration ranging between about 1% and 30% weight of the photoresist layer 116.

The photoresist layer 116 may additionally include other components, such as a quencher distributed in the solvent and polymeric material. In the present example, the quencher is base type and is capable of neutralizing acid. Collectively or alternatively, the quencher may inhibit other active components of the photoresist layer 116, such as inhibiting photo acid from reaction.

Referring to FIG. 2, the semiconductor structure 100 is then transferred to a lithography apparatus for an exposing process. In one embodiment, the exposing process utilizes a photolithographic technique with proper radiation source and corresponding radiation energy. In the exposing process, the photoresist layer 116 is exposed to a radiation energy through a photomask (mask or reticle) having a predefined pattern, resulting in a latent photoresist pattern that includes a plurality of exposed regions such as exposed features 116a and a plurality of unexposed regions 116b. In various examples, the radiation energy may include a 248 nm beam by Krypton Fluoride (KrF) excimer lasers, a 193 nm beam by Argon Fluoride (ArF) excimer lasers, a 157 nm beam by Fluoride (F2) Excimer Lasers, or Extreme ultra-violet (EUV) light, such as EUV light with wavelength at about 13.5 nm. After the exposing process, other processing steps, such as a post-exposure-baking (PEB) process is followed.

Referring to FIG. 3, the photoresist layer 116 is developed by a developer to form a patterned photoresist layer. In the present example, the photoresist layer 116 has positive-tone, the exposed portions 116a of the photoresist layer are removed by a developer, such as tetramethyl ammonium hydroxide (TMAH). In one example, the developer includes a TMAH solution with a proper concentration, such as about 2.38%. However, negative-tone photoresist layer and/or negative-tone developer may be alternatively used. After the developing, the photoresist layer 116 may proceed to other processing steps, such as a hard-baking process. The exposing process using the photomask and the photolithography apparatus may be implemented or replaced by other proper technique such as maskless photolithography, electron-beam writing, ion-beam writing, and molecular imprint Referring to FIG. 4, a first etching process is applied to the middle layer 114 using the patterned photoresist layer 116 as an etch mask, thereby transferring the pattern from the patterned photoresist layer 116 to the middle layer 114. In various embodiments, the first etching process may include dry etching, wet etching or a combination thereof. In the present example, the etching process includes a plasma etching process using an etchant having fluorine, such as CF2, CF3, CF4, C2F2, C2F3, C3F4, C4F4, C4F6, C5F6, C6F6, C6F8, or a combination thereof.

Referring to FIG. 5, the photoresist layer 116 may be removed by a proper technique, such as wet stripping or plasma ashing, after the middle layer 114 is patterned by the first etching process.

Referring to FIG. 6, a second etching process is applied to the under layer 112 using the patterned middle layer 114 as an etch mask, thereby transferring the pattern from the patterned middle layer 114 to the under layer 112. In various embodiments, the second etching process may include dry etching, wet etching or a combination thereof, with an etchant selectively etching the under layer 112 while the middle layer 114 substantially survives. Since the middle layer 114 is a silicon-containing material while the under layer 112 is a silicon-free material in the present embodiment, the etching selectivity can be achieved through proper choice of the etchant. In the present embodiment, the second etching process includes a plasma etching process using an etchant having a sulfur-containing gas and an oxygen-containing gas. In one example, the oxygen-containing gas includes oxygen (O2). In one example, the sulfur-containing gas includes carbonyl sulfide (COS). In another example, the sulfur-containing gas includes sulfur dioxide (SO2). The second etching process may result in a crust formed on the patterned middle layer 114 and the crust is hard to be removed.

Still referring to FIG. 6, a plasma treatment may be applied to remove the crust according to some embodiments. By using the strippable middle layer 114, the middle layer and the crust are effectively removed by subsequent process. Alternatively or additionally, the plasma treatment is applied to remove the crust formed on the middle layer 114 with a collective removal effect. The plasma treatment includes using a gas having hydrogen H2 and nitrogen N2. The gas is ionized to plasma and is then applied to the semiconductor structure 100 to effectively remove the crust.

In other embodiments, the second etching process and the plasma treatment may be applied to the semiconductor structure 100 in different scheme. For example, the second etching process is segmented and is applied within first time windows, and the plasma treatment is segmented and is applied within second time windows. The second time windows are paired with the first time windows and are followed the corresponding first time windows such that the crust formed by every segment of the second etching process is removed by the corresponding segment of the plasma treatment. In a more particular example, the second etching process is applied for a first duration such that the under layer uncovered by the middle layer is partially removed; then the plasma treatment is applied for a second duration; then the second etching process is applied for a third duration such that the under layer 112 is etched through; then the plasma treatment is applied for a fourth duration; and so on.

In other embodiments, the second etching process and the plasma treatment are integrated and simultaneously implemented in a collective plasma process for both etching and cleaning effects. The collective plasma process is designed to have both etching gas and plasma treatment gas in order to achieve simultaneous etching to remove the under layer 112 and plasma treatment to remove the crust caused by the etching. In furtherance of the embodiments, the collective plasma process is applied to the semiconductor structure 100 with a gas that includes the etching gas (such as a mixture of COS and O2 or a mixture of SO2 and O2) and the treatment gas (N2 and H2), thereby, the crust is simultaneously removed while the under layer 112 is patterned by the etching.

Referring to FIG. 7, a fabrication process is applied to the semiconductor structure 100, such as to a top material layer through the openings of the patterned under layer 112 using the under layer 112 as a mask. In some embodiments, an etching process is applied to the top material layer of the semiconductor substrate 110 using the under layer 112 as an etch mask. In some other embodiments, an ion implantation process 120 is applied to the semiconductor substrate 110 using the under layer as an implantation mask, thereby forming various doped features 122, such as doped wells, in the semiconductor substrate 110. In furtherance of the embodiments, a dielectric material layer, such as silicon oxide, may be interposed between the semiconductor substrate 110 and the under layer 112 as an ion implantation screening layer to enhance the implantation quality, such as reducing the channeling effect during the ion implantation process 120.

Referring to FIG. 8, the middle layer 114 and the under layer 112 are thereafter removed by a wet chemical process. In other words, the middle layer 114 and the under layer 112 are stripped by the wet chemical process. In some embodiments, the wet chemical process includes applying sulfuric peroxide mixture (SPM) and applying ammonia peroxide mixture (APM or SC-1). SPM includes a solution having sulfuric acid (H2SO4) and hydrogen peroxide (H2O2). In the present example, the SPM is heated to a high temperature (higher than room temperature) when it is applied to the semiconductor structure 100. APM includes a solution having ammonium hydroxide (NH4OH), hydrogen peroxide (H2O2) and water (H2O). The SPM and APM are applied to the semiconductor structure 100 sequentially in either order according to various embodiments. In other embodiments, the wet chemical process further includes applying a diluted hydrofluoric acid (DHF) to the semiconductor structure 100.

By using the strippable middle layer 114 and additionally or alternatively applying a plasma treatment using the gas having H2 and N2, the middle layer 114 and the crust are effectively removed without damaging the substrate 110. In various embodiments, the plasma treatment may be applied after the fabrication process using the patterned under layer 112 as a processing mask, during or simultaneously with the second etching process.

Figure 19:
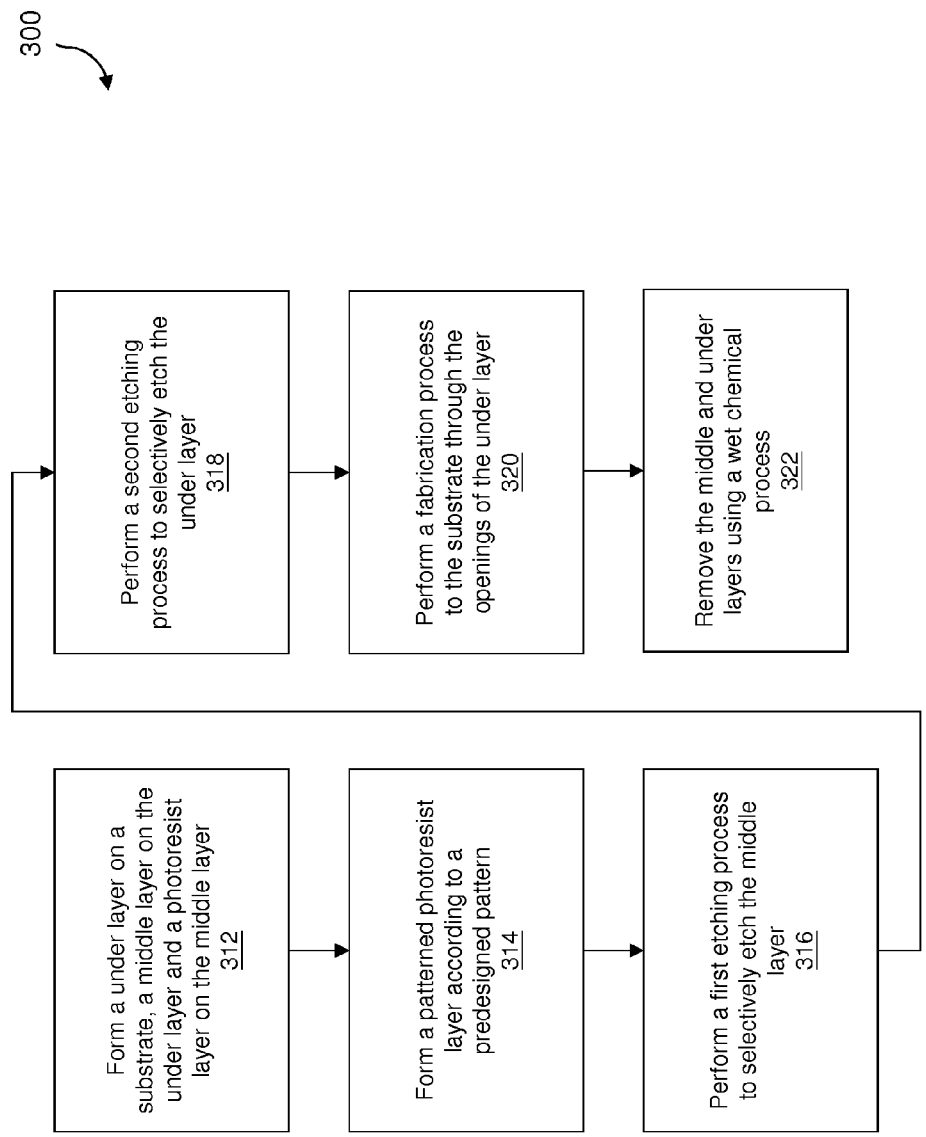
FIG. 19 is a flowchart of a method for a photolithography process constructed according aspects of the present disclosure in one embodiment.

FIG. 19 is a flowchart of a method 300 to pattern a workpiece, such as the semiconductor structure 100, constructed in accordance with some embodiments. The method 300 includes an operation 312 by forming a under layer 112, a middle layer 114 and a photoresist layer 116. Particularly, the operation 312 further includes forming a under layer 112 on a substrate 110, a middle layer 114 on the under layer 112 and a photoresist layer 116 on the middle layer 114. In some embodiments, the substrate 110 is a semiconductor substrate, such as a silicon substrate. In some embodiments, the under layer 112 is designed to provide resistance to etching and/or ion implantation. The under layer 112 functions as a mask to protects the substrate 110 from etching and/or ion implantation. In some embodiments, the under layer 112 includes an organic polymer free of silicon. In some embodiments, the formation of the under layer 112 includes spin-on coating and a thermal baking process with a suitable baking temperature.

In the present embodiment, the middle layer 114 is a silicon-containing layer designed to provide etch selectivity from the under layer 112. In furtherance of the embodiment, the middle layer 114 functions an etch mask to transfer a pattern to the under layer 112. The silicon-containing middle layer 114 and the silicon-free under layer 112 are designed to have etching selectivity from each other. In some embodiments, the formation of the middle layer 114 includes spin-on coating and a thermal baking process with a suitable baking temperature. In the present embodiment, the middle layer 114 is designed to be a wet strippable middle layer, such as a silicon-containing layer having a silicon concentration by weight percentage less than about 20%.

The photoresist layer 116 is photosensitive and is patterned by a photolithography process. The photoresist layer 116 is disposed on the middle layer 114 by a procedure that includes spin-on coating and a baking process, such as soft baking.

The method 300 includes an operation 314 by forming a patterned photoresist layer 116 according to a predefined circuit pattern, such as a circuit layout, using a photolithography process. In some embodiments, the photolithography process in the operation 320 includes an exposing process and a developing process applied to the photoresist layer 116, thereby forming a patterned photoresist layer 116. The exposing process utilizes a photolithographic technique with proper radiation source and corresponding radiation energy, such as DUV or EUV. During the exposing process, the photoresist layer 116 is exposed to radiation energy through a photomask having a predefined pattern, resulting in a latent photoresist pattern that includes exposed regions 116a and unexposed regions 116b. The photoresist layer 116 within the exposed regions is chemically changed such that the exposed portions are removed during the developing process or alternatively the unexposed portions are removed during the developing process, depending on the type of the photoresist layer 116 and the type of the developer. In some embodiments, the developing process is designed to remove the portions (the exposed or unexposed) of the photoresist layer by the developer in a proper mode, such as spraying or immersion. The formation of the patterned photoresist layer 116 may further include other processing steps, such as PEB after the exposing process and/or a hard baking process after the developing process. The exposing process may be alternatively replaced by other proper technique such as maskless photolithography, electron-beam writing, ion-beam writing, or molecular imprint.

The method 300 includes an operation 316 by performing a first etching process to selectively etch the middle layer 114, thereby transferring the circuit pattern from the patterned photoresist layer 116 to the middle layer 114. The first etching process is applied to the middle layer 114 using the patterned photoresist layer 116 as an etch mask. In various embodiments, the first etching process may include dry etching, wet etching or a combination. In the present example, the first etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof. After the operation 316, the photoresist layer 116 may be removed by a proper technique, such as wet stripping or plasma ashing.

The method 300 includes an operation 318 by performing a second etching process to selectively etch the under layer 112, thereby transferring the circuit pattern from the patterned middle layer 114 to the under layer 112. The second etching process is applied to the under layer 112 using the patterned middle layer 114 as an etch mask. In various embodiments, the second etching process may include dry etching, wet etching or a combination. In one example, the second etching process includes a plasma etching process using an etchant having carbonyl sulfide (COS) and oxygen ($O_2$). In another example, the second etching process includes a plasma etching process using an etchant having sulfur dioxide ($SO_2$) and oxygen ($O_2$). After the second etching process, a crust is formed on the patterned middle layer 114.

The method 300 includes an operation 320 by performing a fabrication process to the workpiece using the patterned under layer 112 as a mask such that the fabrication process is only applied to the portions of the workpiece within the openings of the under layer 112 while other portions of the workpiece covered by the under layer 112 is protected from being impacted by the fabrication process. In some embodiments, the fabrication process includes an etching process applied to the top material layer of the semiconductor substrate 110 using the under layer 112 as an etch mask. In some embodiments, the fabrication process includes an ion implantation process applied to the semiconductor substrate 110 using the under layer as an implantation mask, thereby forming various doped features in the semiconductor substrate 110.

The method 300 includes an operation 322 by removing the middle layer 114 and the under layer 112. After the operation 350, the middle layer 114 and the under layer 112 are removed by a wet chemical process using wet chemicals. In some embodiments, the wet chemical process includes applying sulfuric peroxide mixture (SPM) and applying ammonia peroxide mixture (APM or SC-1). SPM includes a solution having sulfuric acid ($H_2SO_4$) and hydrogen peroxide ($H_2O_2$). APM includes a solution having ammonium hydroxide ($NH_4OH$), hydrogen peroxide ($H_2O_2$) and water ($H_2O$). The SPM and APM are applied to the workpiece sequentially in either order according to various embodiments. In other embodiments, the wet chemical process further includes applying a diluted hydrofluoric acid (DHF) to the workpiece.

Figure 20:
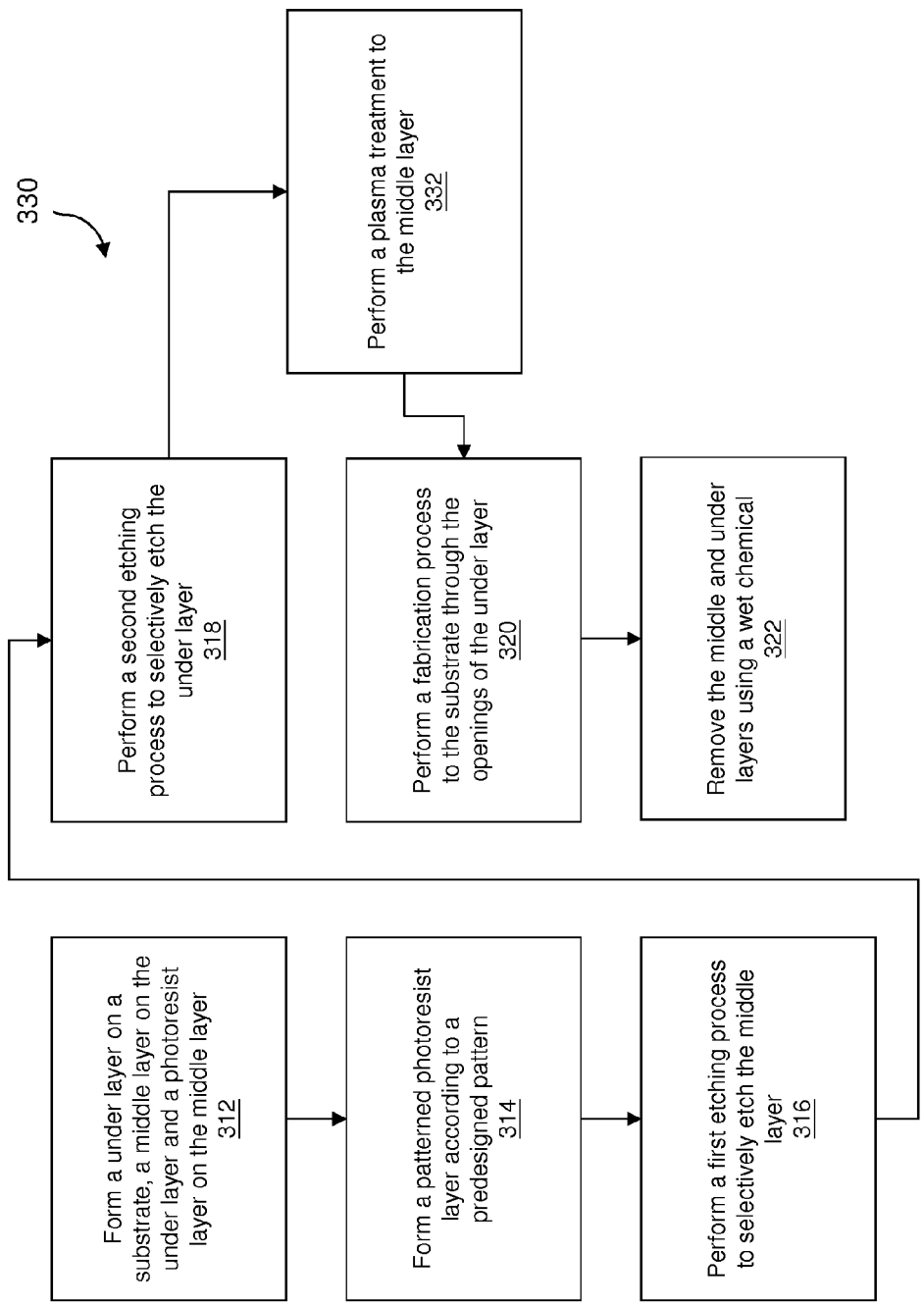
FIG. 20 is a flowchart of a method for a photolithography process constructed according aspects of the present disclosure in one embodiment.

FIG. 20 is a flowchart of a method 330 to pattern a workpiece, such as the semiconductor structure 100, constructed in accordance with some embodiments. The method 330 is similar to the method 300 in FIG. 19. However, the method 330 further includes an operation 332 by performing a plasma treatment to the workpiece. The plasma treatment is applied to remove the crust, which is formed on the middle layer 114 by the second etching process. In some embodiments, the operation is implemented after the operation 318. In the present embodiment, the plasma treatment includes using a gas having hydrogen H2 and nitrogen N2. The gas is ionized to plasma and is then applied to the semiconductor structure 100 to effectively remove the crust.

Figure 21:
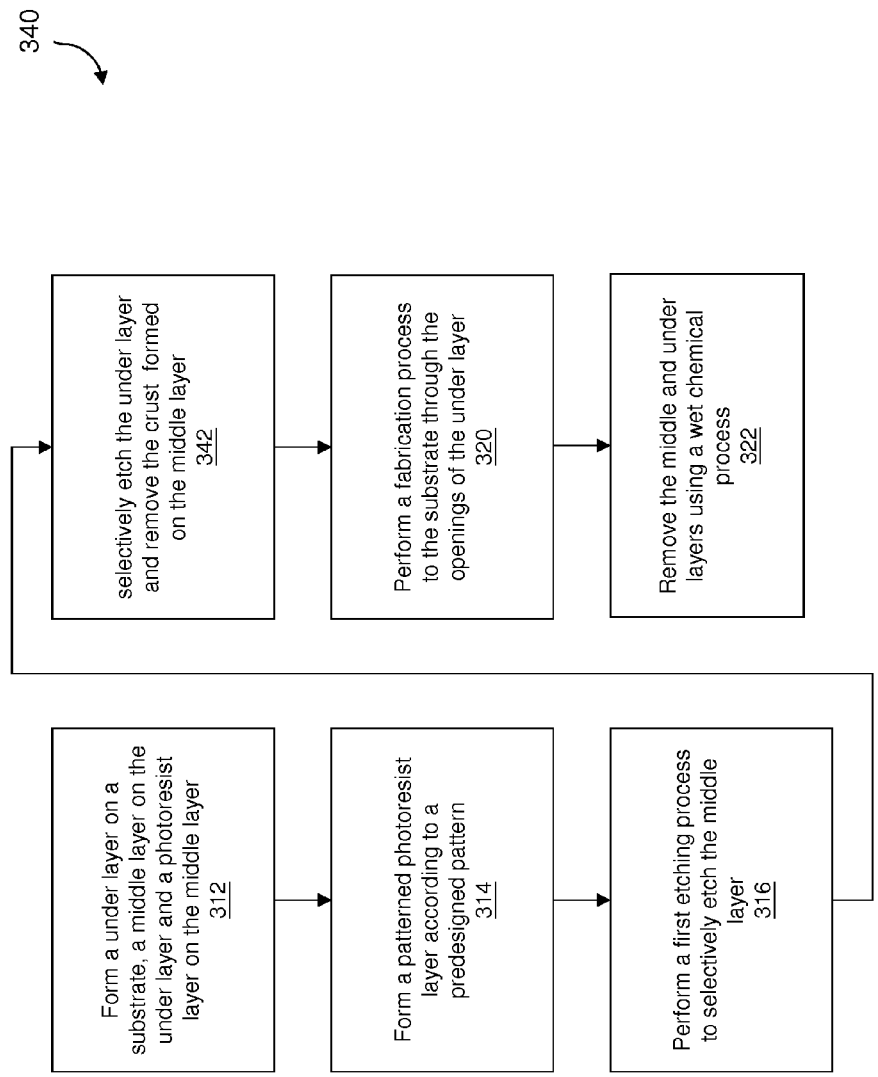
FIG. 21 is a flowchart of a method for a photolithography process constructed according aspects of the present disclosure in one embodiment.

FIG. 21 is a flowchart of a method 340 to pattern a workpiece, such as the semiconductor structure 100, constructed in accordance with some embodiments. The method 340 is similar to the method 330 in FIG. 19. The method 340 also includes performing a plasma treatment to remove the crust. However, the plasma treatment is applied in different mode. Particularly, the method 340 includes an operation 342 by selectively etching the under layer 112 and removing the crust.

In the operation 342, the second etching process and the plasma treatment are integrated into a collective plasma process that selectively etches the under layer 112 and removes the crust. The collective plasma process is designed to have both etching and cleaning (removing the crust) effects. The collective plasma process uses both the etching gas and the plasma treatment gas to simultaneously achieve etching to the under layer 112 and plasma treatment to the middle layer 114. The plasma treatment aims to remove the crust, which is caused by the etching. In furtherance of the embodiments, the collective plasma process is applied to the semiconductor structure 100 with a gas that includes the etching gas (such as a mixture of COS and O2 or a mixture of SO2 and O2) and the treatment gas (N2 and H2), thereby, the under layer is selective etched and the crust is removed as well.

In some other embodiments, the operation 342 includes the second etching process and the plasma treatment segmented and interdigitized. For example, the second etching process is segmented and is applied within first time windows, and the plasma treatment is segmented and is applied within second time windows. The second time windows are paired with the first time windows and are followed the corresponding first time windows, such that the crust formed by each segment of the second etching process is removed by the corresponding segment of the plasma treatment. In a more particular example, the second etching process is applied for a first duration such that the under layer 112 uncovered by the middle layer 114 is partially removed; then the plasma treatment is applied for a second duration; then the second etching process is applied for a third duration such that the under layer 112 uncovered by the middle layer is etched through; and then the plasma treatment is applied for a fourth duration, thereby removing the crust. In the present embodiment, the plasma treatment includes using a gas having hydrogen H2 and nitrogen N2. The gas is ionized to plasma and is then applied to the semiconductor structure 100 to effectively remove the crust.

In the method 330 or the method 340, since the plasma treatment is incorporated to effectively remove the crust, the middle layer 114 may be different from the strippable middle layer. However, by using the strippable middle layer 114 and the plasma treatment, the middle layer and the crust are more effectively removed by the collective effects of the strippable middle layer and the plasma treatment.

The present disclosure provides a lithography method and a wet-strippable silicon-containing middle layer used in the tri-layer photolithography technology. By using the wet-strippable silicon-containing middle layer, and/or plasma treatment, the middle layer is effectively removed by a wet chemical process without damaging the substrate. In various embodiments, the wet strippable silicon-containing middle layer includes silicon less than 20% in weight percentage. In other embodiments, the plasma treatment is integrated with the second etching process for patterning the under layer into a collective plasma process using the gas containing the etching gas and plasma treatment gas.

A lithography method is provided in accordance with some embodiments. The lithography method includes forming an under layer of a polymeric material on a substrate; forming a silicon-containing middle layer on the under layer, wherein the silicon-containing middle layer has a silicon concentration in weight percentage less than 20% and is wet strippable; forming a patterned photosensitive layer on the silicon-containing middle layer; performing a first etching process to transfer a pattern of the patterned photosensitive layer to the silicon-containing middle layer; performing a second etching process to transfer the pattern to the under layer; and performing a wet stripping process to the silicon-containing middle layer and the under layer.

A lithography method is provided in accordance with some embodiments. The lithography method includes forming an under layer of a polymeric material on a substrate; forming a silicon-containing middle layer on the under layer; forming a patterned photosensitive layer on the silicon-containing middle layer; performing a first etching process to transfer a pattern of the patterned photosensitive layer to the silicon-containing middle layer; performing a second etching process to transfer the pattern to the under layer; performing a plasma treatment to the silicon-containing middle layer; and performing a wet stripping process to remove the silicon-containing middle layer and the under layer.

A lithography method is provided in accordance with some embodiments. The lithography method includes forming a silicon-containing middle layer on a semiconductor substrate; and performing a baking process to the silicon-containing middle layer. The silicon-containing middle layer has a silicon concentration in weight percentage less than 20% and is wet strippable. The silicon-containing middle layer includes a chemical structure as

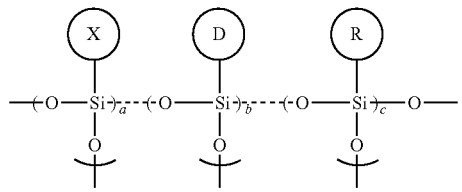

In the chemical structure, O and Si represent oxygen and silicon, respectively; a, b and c represent weight percentage of X, D and R groups, respectively; X represents a first organic group that provides cross-linking sites; D represents an aromatic group designed to tune extinction coefficient and index of refraction; and R represents a second organic group that enhances etching resistance, adhesion of the photosensitive layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography method, comprising:
    forming an under layer of a polymeric material on a substrate;
    forming a silicon-containing middle layer on the under layer, wherein the silicon-containing middle layer includes a polymer chain having a first segment having an O—Si—O bond structure, a second segment having an O—Si—O bond structure, and a third segment having an O—Si—O bond structure, wherein the first segment is connected to the second segment by a first acid-cleavable group and the second segment is connected to the third segment by a second acid-cleavable group;
    forming a patterned photosensitive layer on the silicon-containing middle layer;
    performing a first etching process to transfer a pattern on of the patterned photosensitive layer to the silicon-containing middle layer;
    performing a second etching process to transfer the pattern to the under layer); and
    performing a wet stripping process to the silicon-containing middle layer and the under layer.

2. The method of claim 1, further comprising:
    performing one of etching and ion implantation to the substrate, after the performing of the second etching process and before the performing of the wet stripping process.

3. The method of claim 1, wherein the performing of the wet stripping process includes:
    applying a first mixture of sulfuric acid and peroxide;
    applying a second mixture of ammonia acid, peroxide and water; and
    applying a diluted hydrofluoric acid.

4. The method of claim 1, wherein the forming of the silicon-containing middle layer includes:
    coating the substrate with a solution having a silicon-containing polymeric material; and
    performing a curing process to the solution, thereby cross-linking the silicon-containing polymeric material to form the silicon-containing middle layer.

5. The method of claim 1, wherein the silicon-containing middle layer includes a chemical structure as

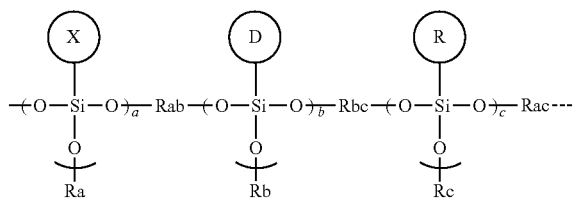

wherein O and Si represent oxygen and silicon, respectively;
a, b and c represent weight percentage of the first, second and third segments, respectively;

X represents a first organic group that provides cross-linking sites;

D represents an aromatic group designed to tune extinction coefficient and index of refraction; and R represents a second organic group that enhances etching resistance and adhesion of the photosensitive layer;

wherein Rab, Rbc, Rac, Ra, Rb and Rc are the acid-cleavable groups, wherein each of Rab, Rbc and Rac includes a chemical structure selected from the group consisting of aromatic rings, aliphatic groups, heterocyclic rings, —C(=O)—, —C(=NR)—, —SO2, —S(=O)—, —COOR, —CONHR, —CONR2, ethers, alkenes, alkynes, and a combination thereof.

6. The method of claim 5, wherein the first organic group X has an alkyl group containing 2 to 20 carbons and has at least one crosslinkable functional group selected from the group consisting of —I, —Br, —Cl, —NH2, —COOH, —OH, —SH, —N3, epoxy, alkyne, alkene, ketone, aldehyde, ester, acyl halide, NHS ester, Imidoester, pentafluorophenyl ester, Hydroxymethyl phosphine, Carbodiimide, Maleimide, Haloacetyl, Pyridyldisulfide, Thiosulfonate, Vinylsulfone, Hydrazide, Alkoxyamine, Diazirine, Aryl azide, Isocyanate, Phosphine, Amide, ether, and a combination thereof.

7. The method of claim 5, wherein the aromatic group D is a chromophore and has an alkyl group containing 3 to 20 carbons, wherein the aromatic group D has at least one light-sensitive functional group selected from the group consisting of phenyl, napthlenyl, phenanthrenyl, anthracenyl, phenalenyl, and other aromatic derivatives containing one to five-membered rings.

8. The method of claim 5, wherein the second organic group R is an alkyl group containing 1 to 20 carbons, wherein the alkyl group includes a chemical selected from the group consisting of —I, —Br, —Cl, —NH2, —COOH, —OH, —SH, —N3, —S(=O)—, alkene, alkyne, imine, ether, ester, aldehyde, ketone, amide, sulfone, acetic acid, cyanide, or a combination thereof.

9. The method of claim 1, wherein the silicon-containing middle layer includes an electron donating group selected from the group consisting of primary, secondary, tertiary carbon groups, aromatic rings, aliphatic groups, heterocyclic rings, —OR, —OH, NR2, —NHR, —NH2, —SR, —SH, —PR3, —PHR2, —PH2R, —PH3, alkenes, alkynes, and a combination thereof.

10. The method of claim 1, wherein the silicon-containing middle layer includes an electron withdrawing group selected from the group consisting of aromatic rings, aliphatic groups, heterocyclic rings, —CN, —NO2, —C(=O)—, —COOH, —C(=NR)—, —SO2, —S(=O)—, —COOR, —OH, —CONHR, —CONR2, alkenes, alkynes, halides, and a combination thereof.

11. The method of claim 1, further comprising performing a plasma treatment to the silicon-containing middle layer.

12. The method of claim 11, wherein
the second etching process is a plasma etching process using a mixture of sulfur-containing gas and oxygen (O2); and
the plasma treatment uses a gas containing nitrogen (N2) and hydrogen (H2).

13. The method of claim 12, wherein the plasma treatment and the second etching process are simultaneously implemented in a plasma process using a gas containing the sulfur-containing gas, O2, N2 and H2.

14. The method of claim 11, wherein
the second etching process is segmented to be implemented in first time windows;
the plasma treatment is segmented to be implemented in second time windows; and
the second time windows are paired with the first time windows, each of the second time windows is after a paired one of the second time windows.

15. A lithography method, comprising:
forming an under layer of a polymeric material on a substrate;
forming a silicon-containing middle layer on the under layer, wherein the silicon-containing middle layer has a silicon concentration in weight percentage less than 20% and is wet strippable;
forming a patterned photosensitive layer on the silicon-containing middle layer;
performing a first etching process to transfer a pattern of the patterned photosensitive layer to the silicon-containing middle layer;
performing a second etching process to transfer the pattern to the under layer using a mixture of sulfur-containing gas and oxygen (O2);
performing a plasma treatment to the silicon-containing middle layer using a gas containing nitrogen (N2) and hydrogen (H2); and
performing a wet stripping process to remove the silicon-containing middle layer and the under layer.

16. The method of claim 15, wherein the plasma treatment and the second etching process are simultaneously implemented in a collective plasma process using a mixture of a sulfur-containing gas, O2, N2 and H2.

17. The method of claim 15, wherein
the second etching process is segmented to be implemented in first time windows;
the plasma treatment is segmented to be implemented in second time windows; and
the second time windows are paired with the first time windows, each of the second time windows is after a paired one of the second time windows.

18. The method of claim 15, wherein the forming of the silicon-containing middle layer includes forming the silicon-containing middle layer that includes a chemical structure as

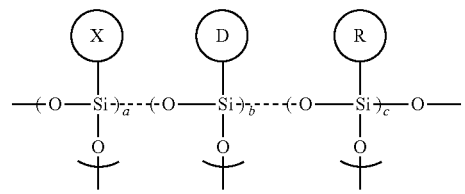

wherein O and Si represent oxygen and silicon, respectively;

a, b and c represent weight percentage of O—Si groups, respectively;

X represents a first organic group that provides cross-linking sites;

D represents an aromatic group designed to tune extinction coefficient and index of refraction; and R represents a second organic group that enhances etching resistance and adhesion of the photosensitive layer.

19. A lithography method, comprising:
forming a silicon-containing middle layer on a semiconductor substrate; and
performing a baking process to the silicon-containing middle layer, wherein the silicon-containing middle layer has a silicon concentration in weight percentage less than 20% and is wet strippable, wherein the silicon-containing middle layer includes a chemical structure as

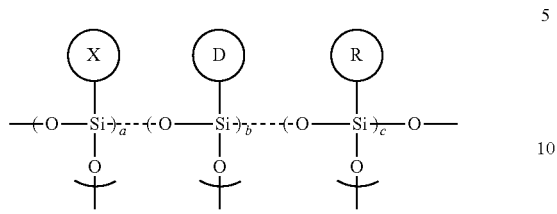

wherein O and Si represent oxygen and silicon, respectively;
a, b and c represent weight percentage of O—Si groups, respectively;
X represents a first organic group that provides cross-linking sites;
D represents an aromatic group designed to tune extinction coefficient and index of refraction; and
R represents a second organic group that enhances etching resistance and adhesion of the photosensitive layer.

20. The method of claim 19, wherein the chemical structure includes acid-cleavable groups to bond the O—Si groups to form an acid-cleavable polymer backbone.

* * * * *